Figure 1:
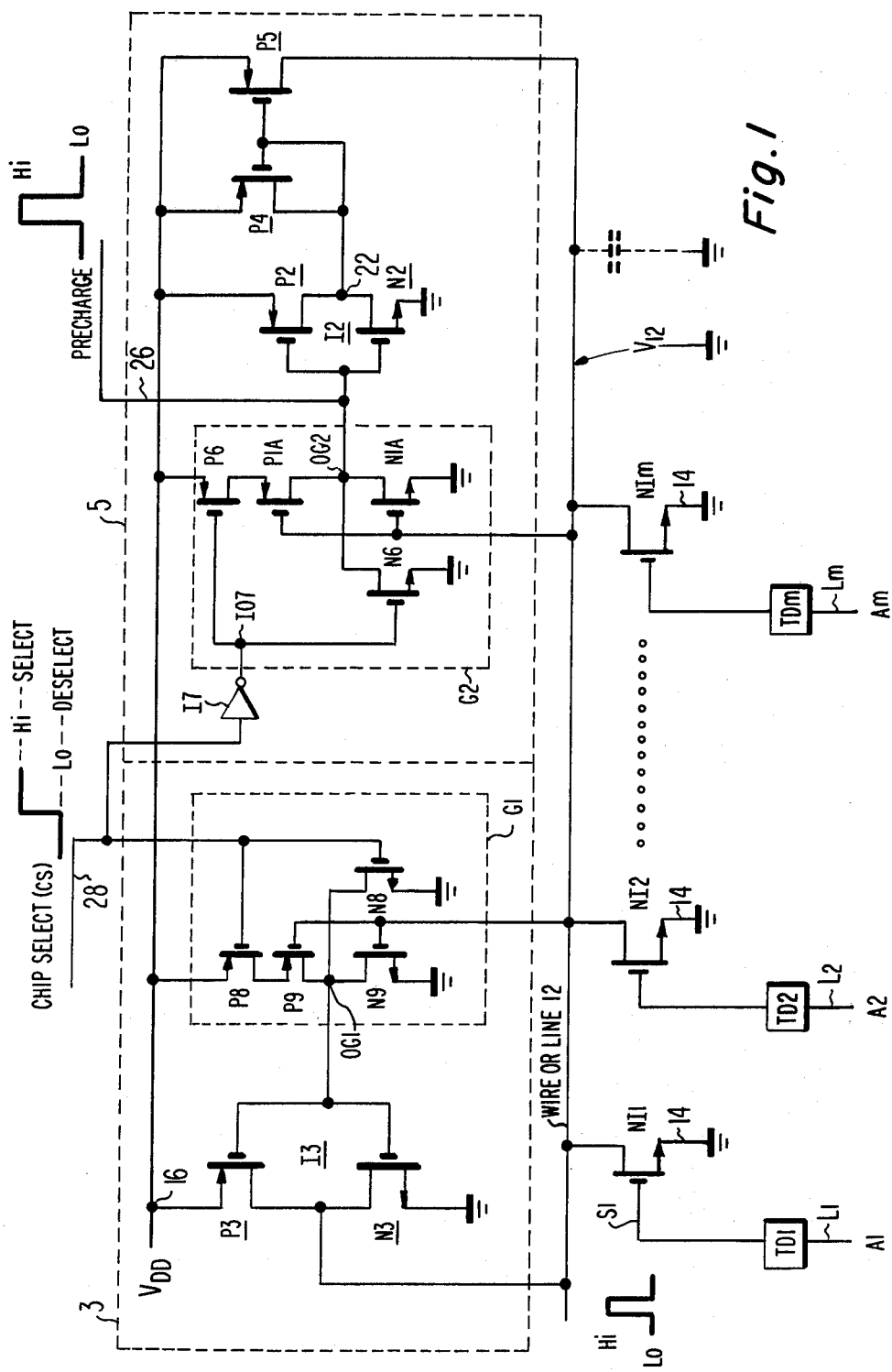

United States Patent [19]

Stewart

[11] 4,405,996
[45] Sep. 20, 1983

[54] PRECHARGE WITH POWER CONSERVATION

[75] Inventor: Roger G. Stewart, Neshanic Station, N.J.

[73] Assignee: RCA Corporation, New York, N.Y.

[21] Appl. No.: 232,303

[22] Filed: Feb. 6, 1981

[51] Int. Cl.³ .................................................. G11C 7/00
[52] U.S. Cl. .................................... 365/203; 365/189; 365/227
[58] Field of Search ......................... 365/203, 227, 189

[56] References Cited

U.S. PATENT DOCUMENTS 3,942,162 3/1976 Buchanan ............................. 365/203
4,338,679 7/1982 O'Toole .............................. 365/203

FOREIGN PATENT DOCUMENTS 54-152931 12/1979 Japan .................................... 365/203

Primary Examiner—Stuart N. Hecker
Attorney, Agent, or Firm—Joseph S. Tripoli; Henry I. Schanzer

[57] ABSTRACT

A circuit having a "selected" and a "deselected" operating mode includes a controllable latch which is operable when the circuit is "deselected" and a controllable pulse generating network which is operable when the circuit is "selected". The latch senses and stores a signal evidencing a change of state of any one of certain input signals to the circuit when the circuit is deselected. The pulse network is responsive to the stored signal and produces a pulse, indicative of the occurrence of a change, when the circuit is subsequently selected.

10 Claims, 2 Drawing Figures

PRECHARGE WITH POWER CONSERVATION

This invention relates to a circuit which, in one mode, stores an input signal and which, in another mode, produces an output signal responsive to the stored input signal.

In many applications it is necessary to produce a signal indicating that one or more of a multiplicity of events or conditions has occurred. By way of example, in a high speed memory it is desirable to quickly sense (detect) a change on any of the many word and bit address lines and to then produce a pulse or signal to precharge, or precondition, various portions of the memory circuit and to perform certain housekeeping functions prior to the read-out of information from the memory or the writing of information into the memory.

Precharging and preconditioning the various portions of a memory system tends to consume a considerable amount of power. Much of the power is unnecessarily wasted since in a large memory system, having a large number of subsystems, many of the subsystems are not needed during a particular operating cycle. Power consumption can be reduced by precharging and conditioning only those subsystems which are needed during the operating cycle. This can be achieved by a control signal coupled to the various subsystems which "selects", for precharging, the subsystems to be read during an operating cycle. However, in addition to low power consumption, it is desirable and/or necessary that the memory system be operable in an asynchronous manner. That is, the addresses or other input signals can change before, after, or at the same time as the control signal.

A problem with an asynchronous system is that an address or other input signal change can occur affecting or related to, an as yet non-selected subsystem. The change causes the generation of a precharge pulse which may terminate prior to the selection of the affected subsystem. Subsequently, when the subsystem is selected, it will not be placed in an operative state and will either not respond to or will respond incorrectly to the new set of addresses. This problem may be overcome by generating a precharge pulse each time a subsystem is selected. However, this is undesirable since it requires the generation of a precharge pulse even when not needed (e.g. when there is no change in address) and results in significant power dissipation.

In a circuit embodying the invention, the problem discussed above is resolved by sensing and storing a signal manifesting the occurrence of an input signal (e.g. address) change (equivalent to a precharge request) when the circuit is deselected and subsequently processing the stored signal, indicative of the occurrence, when the circuit is selected.

A circuit embodying the invention includes a line to which are connected a multiplicity of input signal responsive transistors which, when turned-on, tend to clamp the line to a first voltage level. The circuit includes a controllable latch connected to the line responsive to the voltage on said line which, when enabled, holds said line at said first voltage level in response to the turn-on of one of said input signal responsive transistors. Also included is a controllable pulse generating network responsive to the votlage on said line which, when enabled, restores the voltage on said line to a second voltage level if the voltage on said line is at said first level. The circuit also includes a control signal coupled to the latch and the pulse generating network for enabling the latch and disabling the pulse network during one time interval and for disabling the latch and enabling the pulse network during a subsequent time interval.

Figure 2:
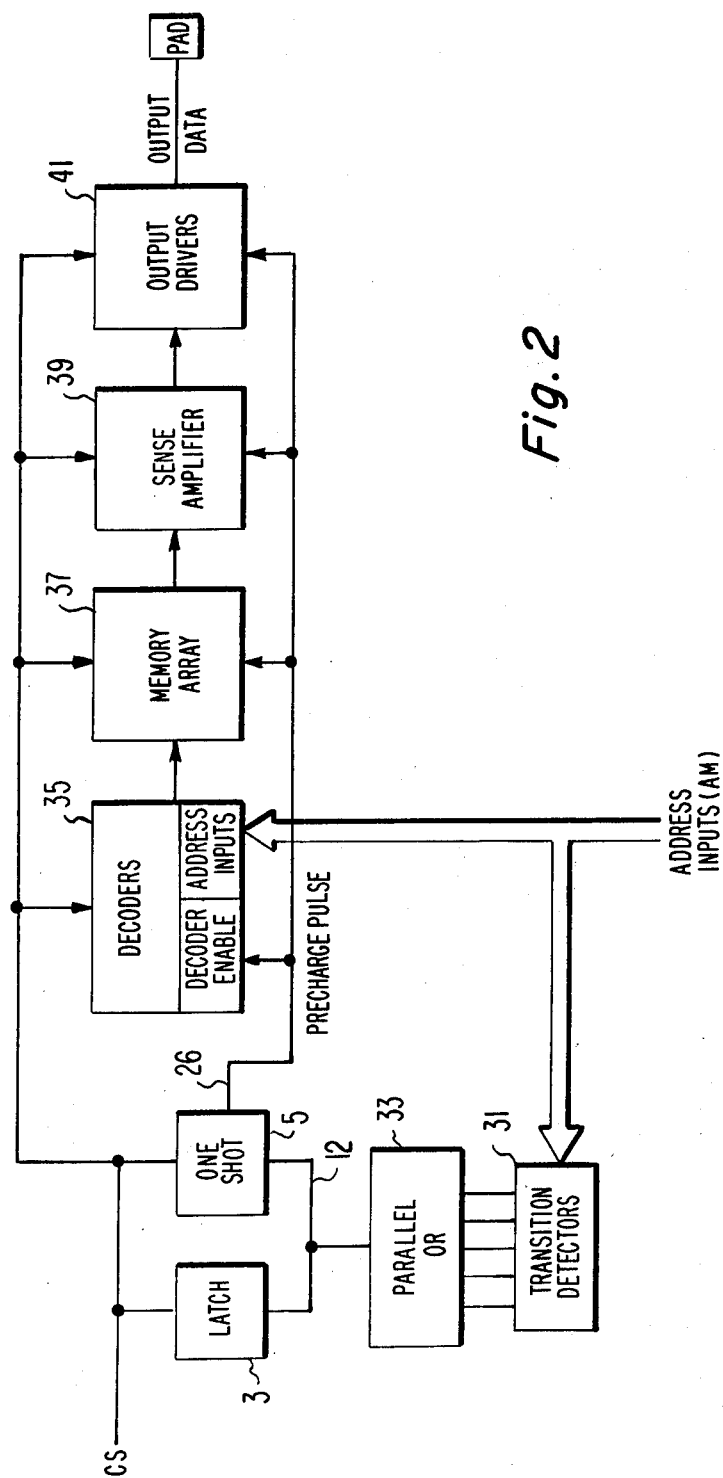

In the accompanying drawing like reference characters denote like components, and FIG. 1 is a schematic diagram of a circuit embodying the invention; and FIG. 2 is a block diagram of a memory subsystem employing the circuit of the invention.

Insulated-gate field-effect transistors (IGFETs) are the active devices preferred for use in practicing the invention. For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P conductivity type are identified by the letter P followed by a particular reference character; and enhancement type IGFETs of N-conductivity type are identified by the letter N followed by a particular reference character. The characteristics of IGFETs are well known and need not be described in detail. But, for a clearer understanding of the description to follow, definitions and characteristics of IGFETs pertinent to the invention are set forth in column 2 of U.S. Pat. Nos. 4,037,114 and 4,001,606 and are incorporated herein by reference.

In the discussion to follow, a potential at, or near, ground is arbitrarily defined as a logic "0" or "low" condition, and any potential at or near $+V_{DD}$ volts is arbitrarily defined as logic "1" or "high" condition.

The circuit of FIG. 1 includes insulated-gate field-effect transistors (IGFETs) NI1 through NIm, having their conduction paths connected in parallel between a WIRE-OR LINE 12 and ground potential. The gate electrode of each one of the transistors NIi, where $1 \leq i \leq m$, is connected to the output of a corresponding transition detector (TDi). The input of each TDi is connected to an address line Li to which is applied an address signal Ai. The transition detectors may be, for example, of the type shown in FIG. 1 or 3 of U.S. Pat. No. 4,039,858 titled TRANSITION DETECTOR; although any other suitable transition detector may be used instead. Whenever an address Ai on any one of the address lines changes from a "high" to a "low" or from a "low" to a "high" its corresponding transition detector TDi produces a positive going pulse Si, as shown in FIG. 3 of the patent, which is applied to the gate electrode of its corresponding NIi transistor. [The signal Si is the inverse or complement of the "C" output shown in FIG. 1 of the cited patent.] Thus, a positive going input pulse Si is produced per signal transition on address line Li. Each input signal responsive transistor NIi is, therefore, normally turned-off, being turned-on only when its corresponding Si signal is high.

Returning to the present application, the circuit load includes a latch network 3 and a pulse forming network 5 controlled by a chip select (CS) signal on line 28. When CS is "low" the circuit is set to its "deselect" condition for which latch 3 is enabled and network 5 is disabled. When CS is "high" the circuit is set to its "select" condition for which latch 3 is disabled and network 5 is enabled. The latch 3 includes a two-input NOR gate G1 and an inverter I3. One input to gate G1 is the Chip Select (CS) signal and the other input is the voltage V12. The output OG1 of gate G1 is connected to the input of inverter I3 whose output is connected to line 12. Gate G1 includes IGFETs P8 and N8 connected at their gate electrodes to CS line 28 and IGFETs P9 and N9 connected at their gate electrodes to line 12. The source-to-drain (conduction) paths of P8 and P9 are connected in series between power supply line 16 to which is applied $V_{DD}$ volts and OG1. The conduction paths of N8 and N9 are connected in parallel between OG1 and ground.

Inverter I3 includes IGFETs P3 and N3 having their gate electrodes connected to OG1 and their drains to line 12. The source of P3 is connected to line 16 and the source of N3 is returned to ground. The ON impedance (ZP3) of P3 is preferably made substantially greater than the ON impedance (ZN3) of N3, while ZN3 is made to be approximately equal to the ON impedance (ZN) of the NIi transistors. In one particular design of the circuit, ZP3 was made one hundred times greater than ZN3. The output of I3 is regeneratively fed back to an input of G1 whereby G1 and I3 function as a latch or bistable circuit responsive to signals on WIRE-OR line 12 when the CS signal is "low".

The pulse forming network 5 includes an inverter I7, a two-input NOR gate G2, an inverter I2, and a current mirror comprised of IGFETs P4 and P5. Inverter I7 is connected at its input to CS line 28 and at its output to one input of gate G2. The other input to gate G2 is the voltage V12 on line 12. Gate G2 includes IGFETs P6 and N6 having their gate electrodes connected to the output of I7 and IGFETs P1a and N1a having their gate electrodes connected to line 12. P6 and P1a having their conduction paths connected in series between line 16 and the output OG2 of gate G2, while N6 and N1a have their conduction paths connected in parallel between OG2 and ground. Output OG2 is connected to line 26, on which is produced a precharge pulse, and to the input of inverter I2.

Inverter I2 comprises two transistors (N2 and P2) of complementary conductivity type having their conduction paths connected in series between $V_{DD}$ and ground. The gate electrodes of P2 and N2 are connected in common and define the input of I2. The drains of N2 and P2 are connected in common at node 22 which defines the output of I2, and to which are connected the gate and drain electrodes of P4 and the gate electrode of P5. When gate G2 is enabled during the "select" condition, P1A and N1A function as an inverter for the signal on line 12. For this condition, gate G2 and inverter I2, in addition to amplifying and inverting the signals at their input, also function as a delay network. That is, the signal on line 12 is delayed through gate G2 and through I2 prior to being applied to the gate and drain of P4 and to the gate of P5. The propagation delay through inverter I2, is, in part, a function of the sizes of the transistors forming the inverter. The source electrodes of transistors P4 and P5 are connected to terminal 16, their gate electrodes and the drain of P4 are connected in common to node 22, and the drain of transistor P5 is connected to output line 12. P4 and P5 function as a current mirror whose output current, (the drain current I5), is controlled by the source-to-drain current I2, through N2.

In a particular design the transistors of the pulse forming network were designed to have the following relationships: P6=2000p; P1A=800p; P2=10p; P4=30p; P5=300p; N6=3n; N1A=120n; N2=20n; where "p" is a unit of size of a P type transistor and "n" is a unit of size of an N-type transistor, and the larger the size the lower the impedance of the devices.

The operation of the circuit of FIG. 1 will first be explained for the "deselected" condition when CS is "low", and for which latch 3 is enabled and pulse forming network 5 is disabled. When CS is "low", P8 of G1 is turned-ON and N8 is turned-OFF. P9 and N9, then function as an inverter whose input is V12 and whose output is connected to the input of inverter I3. The output of I3 is regeneratively fed back to line 12 which is also the input (gate electrodes) of P9 and N9. Thus, G1 and I3 function as a latch, or flip-flop whose two stable conditions are discussed below.

Assume that line 12 is initially at, or close to, $+V_{DD}$ volts. Then, P9 is turned-off, N9 is turned-on and OG1 is driven to, or close to, ground ("low"). N3 is then turned-off, and P3 is turned-on helping to maintain line 12 at, or close to, $V_{DD}$ volts. The ON impedance (ZP3) of P3 is very high and is designed to allow only sufficient current to pass between terminals 16 and 12 to supply the leakage currents drawn by the NIi transistors, when they are non-conducting.

If any NIi transistor is turned-on (due to an address change) line 12 is discharged to a level close to ground potential since ZNIi is much lower than ZP3. When V12 goes close to ground potential, P9 is turned-on and N9 is turned-off. Since CS is low and P8 is turned-on, P8 and P9 provide a conduction path between $V_{DD}$ and OG1, driving OG1 close to $V_{DD}$ volts, turning off P3, and turning-on N3. N3 is a relatively large device being of comparable size to any of the NIi transistors. N3 once turned-on clamps line 12 to ground potential and maintains line 12 at the "low" level even after the initiating NIi transistor is turned-off. The ratio of N3 to P3 is such that the latch (GI-I3) can be driven from the condition where P3 is ON and N3 is OFF to the condition where P3 is off and N3 is on. But, once the latch is driven to the state where N3 is ON, it remains in that state until the latch is reset by disabling G1 (i.e. by driving CS-high). Thus, once an NIi transistor is turned-on during deselect (when CS is low) the fact that it was turned-on is stored by means of the G1-I3 latch, and the WIRE-OR line 12 remains clamped at, or close to, 0 volt, as long as CS remains low.

When CS is "low", the output I7 is "high", causing P6 to be turned-off, N6 to be turned-on and network 5 to be inhibited or disabled. When N6 is on, the output OG2 of gate G2 and line 26 are clamped to ground potential via the conduction path of N6. Thus, the precharge signal on line 26 is low and remains low whenever CS is low regardless of the signal condition on line 12. The low at OG2 is applied to the input of I2 turning on P2 and turning off N2. P2-ON causes $+V_{DD}$ to be applied to the gate electrodes of P4 and P5 which are then turned-off. Hence, the relatively constant current source formed by P4-P5 is inhibited when CS is low.

The circuit operation for the condition when CS makes a transition from low to high is discussed below. The transition of CS from low to high disables latch 3 and enables network 5. However, latch 3 is designed to respond relatively slowly to the disabling signal and network 5 is designed to respond relatively quickly to ensure that the information stored by the latch causes a precharge pulse of desired width to be produced by the pulse forming network 5.

When CS goes from low to high, P8 of G1 is turned-off and N8 is turned-on, clamping OG1 to ground potential. When OG1 is low, N3 is turned-off and P3 is turned-on. However, latch 3 must store its information until pulse network 5 is fully enabled. Hence, transistor N8 is designed to be a relatively small, high impedance, device to generate a delay before OG1 goes low and before N3 gets turned-off, after CS goes high. Thus, if line 12 was "low" before CS went from low to high, line 12 remains low for a period of time (approximately 25 nanoseconds in this design) after CS goes high. As discussed below, line 12 remains low for the time it takes for the now enabled pulse forming network 5 to respond to the "stored" signal condition on line 12. Of course, if line 12 was high before CS went from low to high, line 12 remains high.

When CS goes from low to high, the output of I7 goes low turning on P6 and turning off N6. P1A and N1A now function as an inverter responsive to the voltage on line 12. The response of circuit 5 to the two possible conditions on line 12 are now examined. If V12 is high, P1A remains turned-off and N1A remains turned-on and continues to clamp OG2 and line 26 to ground. The condition of V12 high indicates that none of the NIi transistors is turned-on and that none had been turned-on during "deselect". Hence, the precharge signal on line 26 is, and remains at the "low" level.

If V12 is low when CS goes high, P1A is turned-on while N1A is turned-off. Recall that V12 is low if an NIi transistor is ON or if an NIi transistor had been turned-on during deselect causing N3 to be turned-on. Thus, with CS high and V12 low, N6 and N1A are turned-off, while P6 and P1A are turned-on. OG2 is driven towards $V_{DD}$ via the conduction paths of P6 and P1A, whereby line 26 is driven high. If V12 is low prior to the time CS goes high, P1A is already waiting in a turned-on (although non-conducting) state and N1A is already in the turned-off state. Thus, when CS goes high, there is very little delay in the response of the P1A, N1A inverter to the signal on line 12 and the positive going signal on line 26 occurs shortly after the CS signal goes high. This signal (on line 26) is identified as the precharge pulse and, as shown in FIG. 2, is routed to various circuits of the memory system which have to be primed and prepared for proper operation. Therefore, the early generation of the positive going edge which is used to set up all the associated circuitry is of great benefit.

When OG2 goes high, P2 is turned-off and N2 is turned-on. The current through the source drain path of N2 flows through the source drain path of P4 and via current mirror action an output current proportional thereto flows through the source drain path of P5 into line 12. Assuming that none of the NIi transistors is now turned-on, the potential on line 12 can rise linearly towards $V_{DD}$ after latch 3 is fully disabled with N3 fully turned-off. When, N3 is not drawing any current, P5 can linearly recharge the line 12 capacitance towards $V_{DD}$. The contribution of P3 is inconsequential because of its very high impedance.

As V12 rises towards $V_{DD}$, a voltage level is reached at which N1A is turned-on clamping OG2 and line 26 towards ground potential. The turn on of N1A terminates the positive going excursion of the precharge signal on line 26. As the signal at OG2 goes low, N2 is turned-off and P2 is turned-on. The turn-on of P2 and the turn-off of N2 causes the turn-off of P4 and P5 inhibiting the further flow of current into line 12 which by this time is at, or close to, $V_{DD}$ volts.

As V12 goes high, P9 of G1 is turned-off and N9 is turned-on. Whereby subsequently, when CS goes low, P3 remains turned-on and N3 is turned-off, which restores the circuit to the initial condition first discussed above.

Thus, in the circuit of FIG. 1 the information (V12-low) indicative that an address change has occurred during the time the circuit was deselected, is preserved and used to subsequently generate an appropriate enabling precharge pulse when the chip is selected. Clearly, this enables the circuit to be "asynchronous". That is, the address line changes do not have to be synchronized with the chip select.

In the circuit of FIG. 1, the inverters and NOR gates have been shown using transistors of complementary conductivity type (P and N), but it should be evident that other inverter and NOR gates could be used. Also, in FIG. 1 NOR gates G1 and G2 (together with I7) were used to control (enable or disable) the latch and pulse forming network. It should be evident that any other suitable control means could be used instead. Also, the latch circuit could be replaced by other suitable circuitry and the pulse forming network could be replaced by a controllable monostable or one shot circuit.

FIG. 2 illustrates in block diagram form a subsystem suitable for use in a much larger memory system, or by itself. The address inputs (Ax) are applied to their respective transition detectors 31 whose outputs Si are applied to the parallel "OR" circuit 33, comprising the input transistors NIi shown in FIG. 1, whose drains are connected to the "OR"ing" line 12. The latch 3 and the one shot 5 are controlled by the CS signal as described in FIG. 1 above. When the system is "deselected" precharge pulses are not produced and the system does not get precharged. As soon as the system is selected (e.g. CS goes high) and there has been a change on an address line, or there occurs a change on any address line, then a precharge pulse is produced "enabling" a decoder 35, a memory array 37, sense amplifiers 39 and output drivers 41. The decoder outputs, when enabled, activate the word and bit lines of array 37 allowing the flow of information between array 39 and the sense amplifier circuitry 39. The memory array 37 could be any one of a number of Random Access Memories (RAMs) or any one of a number of Read-Only Memories (ROMs).

The circuitry shown in FIG. 2 could be formed on one semiconductor chip, part of one chip, or include more than one chip. Although it has been tacitly assumed that a subsystem is a "chip", the subsystem could be part of a chip or include more than one chip.

The CS signal and the precharge signal may be used separately or in combination to control the power dissipation in any or all of the blocks forming the memory subsystem.

In the discussion above, it has been assumed that the precharge pulse is produced in response to a change on any address line. But, it should be evident that other input signals (e.g. write or read enable) could be processed and used in the manner described for the address signals.

What is claimed is:
1. The combination comprising:
 a line,
 a first plurality of transistors having their conduction paths connected in parallel between said line and a circuit point at a first potential, each transistor of said first plurality of transistors tending to drive said line to said first potential when turned-on;

a controllable information storage means responsive to the signal on said line for, when enabled, holding said line at a level indicating whether, or not, one of said first plurality of transistors was turned-on during the period said storage means was enabled;

a controllable pulse forming network responsive to the signal on said line for, when enabled, producing a pulse whenever said line is at said first potential; and means coupled to said information storage means and to said pulse forming network for selectively enabling one of said storage means and pulse network and disabling the other during one time interval and disabling said one and enabling the other during a subsequent time interval.

2. The combination as claimed in claim 1 wherein said means coupled to said information storage means includes means for producing a control signal;

wherein said controllable information storage means includes a two input control gate and an inverter; and wherein the voltage on said line is applied as one input to said two input control gate and said control signal is applied as the other input to said two input control gate.

3. The combination as claimed in claim 2 wherein said two input control gate comprises a NOR gate whose output is connected to the input of said inverter; and wherein the output of said inverter is connected to said line.

4. The combination as claimed in claim 3 wherein said inverter includes a first transistor connected between said line and a first point of potential for, when enabled, clamping said line to said first point of potential, and a controllable impedance means connected between said line and a second circuit point at a second potential for, when enabled, providing a conduction path between said line and said second circuit point; and wherein the ON impedance of said first transistor, when enabled, is substantially less than the ON impedance of said controllable impedance means when enabled.

5. The combination as claimed in claim 4 further including a plurality of input address lines and a plurality of transition detectors, one transition detector and one address line for each one of said first plurality of transistors, each transition detector being connected between its respective address line and its respective transistor; and wherein the ON impedance of said plurality of transistors, when turned-on, is comparable to the ON impedance of said first transistor of said inverter.

6. The combination as claimed in claim 1 wherein said means coupled to said pulse forming network includes means for producing a control signal;

wherein said controllable pulse forming network includes a two input control gate, wherein the voltage on said line is applied as one input to said two input control gates and wherein a signal responsive to said control signal is applied as the other input to said two input control gate is.

7. In a memory system in which various subsystems are precharged for proper operation and in which a precharge signal is generated when any one of certain inputs to the memory system changes state and which further includes control means for selecting or deselecting the various portions of the memory system asynchronously with respect to the occurrence of changes of said certain inputs, the improvement comprising:

means for sensing and storing a signal manifesting the occurrence of a change of state of any one of said certain inputs when said various portions of the memory system are deselected; and means responsive to said stored signal manifestation for subsequently producing a precharge signal when said various portions of the memory system are selected.

8. In a system in which various subsystems are selectively conditioned for proper operation and in which a conditioning signal is generated when any one of certain inputs to the system changes state and which further includes control means for selecting or deselecting the various portions of the system asynchronously with respect to the occurrence of changes of state of said inputs;

the improvement comprising:

means for sensing and storing a signal manifesting the occurrence of a change of state of any one of said certain inputs when said various portions of the system are deselected; and means responsive to said stored signal manifestation for subsequently producing a precharge signal when said various portions of the system are selected.

9. The combination as claimed in claim 8 wherein said system is a memory system.

10. The combination as claimed in claim 9 wherein said means for sensing and storing comprising a latch circuit; and wherein said means responsive to said signal manifestation comprises a pulse generating network.

* * * * *